United States Patent
Sridhar et al.

(10) Patent No.: US 9,438,208 B2
(45) Date of Patent: Sep. 6, 2016

(54) WIDE-BAND DUTY CYCLE CORRECTION CIRCUIT

(71) Applicant: QUALCOMM Incorporated, San Diego, CA (US)

(72) Inventors: Shraddha Sridhar, San Diego, CA (US); Vaishnav Srinivas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/299,779

(22) Filed: Jun. 9, 2014

(65) Prior Publication Data

US 2015/0358001 A1 Dec. 10, 2015

(51) Int. Cl.
*H03K 3/017* (2006.01)
*H03K 5/156* (2006.01)

(52) U.S. Cl.
CPC ............ *H03K 3/017* (2013.01); *H03K 5/1565* (2013.01)

(58) Field of Classification Search
None
See application file for complete search history.

(56) References Cited

U.S. PATENT DOCUMENTS

| | | | | |
|---|---|---|---|---|
| 6,958,639 | B2 * | 10/2005 | Park et al. | ..................... 327/175 |
| 7,298,193 | B2 * | 11/2007 | Agarwal et al. | .............. 327/175 |
| 7,863,957 | B2 | 1/2011 | Jang et al. | |
| 7,940,103 | B2 | 5/2011 | Satoh et al. | |
| 8,624,647 | B2 | 1/2014 | Chong et al. | |
| 2008/0164920 | A1 | 7/2008 | Cho et al. | |
| 2009/0278580 | A1 | 11/2009 | Kim | |
| 2010/0073057 | A1 | 3/2010 | Ku | |
| 2013/0249612 | A1 | 9/2013 | Zerbe et al. | |
| 2014/0003550 | A1 | 1/2014 | Krishnamoorthy et al. | |
| 2014/0152358 | A1 | 6/2014 | Seo | |

OTHER PUBLICATIONS

International Search Report and Written Opinion—PCT/US2015/031007—ISA/EPO—Aug. 13, 2015.

* cited by examiner

*Primary Examiner* — An Luu
(74) *Attorney, Agent, or Firm* — Haynes and Boone, LLP

(57) ABSTRACT

A duty cycle correction circuit includes a rising edge variable delay circuit and a falling edge variable delay circuit. The variable delay for each delay circuit depends upon an uncorrected duty cycle for an uncorrected clock signal being corrected by the duty cycle correction circuit into a corrected clock signal having a desired duty cycle.

21 Claims, 6 Drawing Sheets

WIDE-BAND DUTY CYCLE CORRECTION CIRCUIT

TECHNICAL FIELD

This application relates to duty cycle correction, and more particularly to a duty cycle correction circuit configured to independently delay the rising and falling edges of an uncorrected clock signal.

BACKGROUND

Double data rate (DDR) transmission uses both the falling edge and the rising edge of a data clock for data transmission and reception. A DDR source transmits a data bit or word at every clock edge. Similarly, a DDR receiver receives a data bit or word at every clock edge. In contrast, single data rate transmission at the same clock rate would be twice as slow since only one of the clock edges would be used. Although the use of DDR is thus quite popular, it faces a number of challenges due to its more stringent timing requirements as compared to single edge data transmission.

For example, the DDR clock should have a 50% duty cycle. One can readily appreciate why in that a 50-50 split of the duty cycle for the rising/falling edges of the clock allows the receiver and transmitter the most time possible with each clock edge. As the duty cycle strays from this ideal 50-50 split, one of the clock states has less of each clock cycle than the remaining state. The data eye for the receiver then begins to collapse for the shortened clock state, which leads to undesirable data transmission errors.

Given the importance of striving for a 50% duty cycle, various duty cycle correcting circuits have been implemented. In that regard, a DDR source transmits both the clock and the corresponding data to the DDR receiver. So the data path and the clock path should have balanced delays. Since the duty cycle correction circuit is inserted into the clock path, the duty cycle correction circuit should have a small as possible insertion delay so as to not increase jitter. But conventional duty cycle correction circuits often have undesirable levels of insertion delay. For example, one duty cycle correction technique involves selectively increasing the switching currents in PMOS and NMOS devices for the rising and falling clock edges. This technique has a limited range of correction so to achieve a wide correction range requires several stages cascaded together, which leads to a large insertion delay and also demands more power.

An alternative conventional duty cycle correction circuit involves the use of one of the current clock edges (either rising or falling) to generate a half-cycle clock pulse. To produce the remaining complementary clock edge to complete a clock cycle, the duty cycle correction circuit delays the current clock edge by a half clock cycle and inverts it to create the complementary edge. Although this technique provides a greater range of correction compared to varying the switching currents, note that the clock frequency for a DDR system may range from a relatively low frequency such as a few hundred MHz to several GHz. At the lower frequencies, the half clock cycle delay necessary to generate the complementary clock edge becomes appreciable. Implementing such a lengthy delay demands substantial amounts of power.

Accordingly, there is a need in the art for improved duty cycle correction circuits that are power efficient with minimal jitter and distortion.

SUMMARY

A duty cycle correction circuit is provided with a rising edge variable delay circuit as well as a falling edge variable delay circuit for independently delaying the rising or falling edge of an uncorrected clock signal. Which variable delay circuit is active depends upon the uncorrected duty cycle for an uncorrected clock signal as compared to a desired duty cycle for a corrected clock signal as well as whether the corrected clock signal is inverted with regard to the uncorrected clock signal. In an embodiment in which the corrected clock signal is inverted with regard to the uncorrected clock signal and in which the uncorrected duty cycle is greater than the desired duty cycle, the falling edge variable delay circuit delays the uncorrected clock to produce a first delayed signal. The rising edge variable delay circuit would apply no delay to the uncorrected clock signal to produce a second delayed signal in such an embodiment while the uncorrected duty cycle exceeds the desired duty cycle. Conversely, if the uncorrected duty cycle in such an embodiment for an inverted corrected clock signal is less than the desired duty cycle, the rising edge variable delay circuit delays the second delayed signal so that the corrected clock signal has the desired duty cycle. The falling edge variable delay circuit applies no delay to the first delayed signal while the uncorrected duty cycle exceeds the desired duty cycle.

In alternative embodiments in which the corrected clock signal is not inverted with regard to the uncorrected clock signal, the rising and falling edge variable delay circuits delay their respective clock edges in both the corrected and uncorrected clock signals.

BRIEF DESCRIPTION OF THE DRAWINGS

Embodiments of the disclosed input receiver and their advantages are best understood by referring to the detailed description that follows. It should be appreciated that like reference numerals are used to identify like elements illustrated in one or more of the figures.

DETAILED DESCRIPTION

Figure 1A:
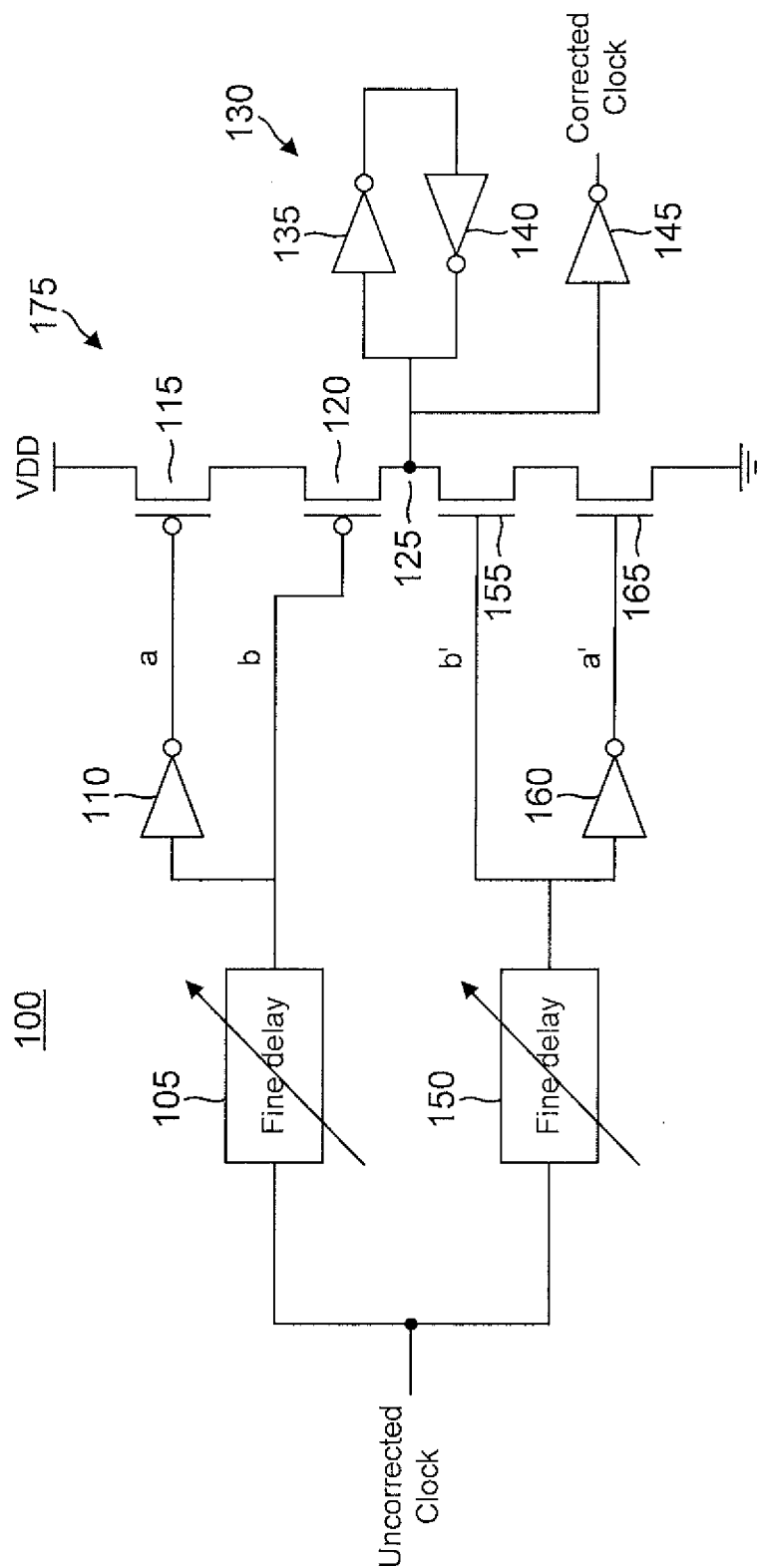
FIG. 1A is a circuit diagram of a duty cycle correction circuit in accordance with a first embodiment of the disclosure.

To provide low-power duty cycle correction with reduced jitter and distortion over a wide range of clock frequencies, a duty cycle correction circuit is provided that includes a rising edge variable delay circuit and a falling edge variable delay circuit. Which variable delay circuit will be active in the duty cycle correction circuit depends upon the uncorrected duty cycle for an uncorrected clock signal as compared to a desired duty cycle for a corrected clock signal. In that regard, since the duty cycle correction circuit includes both a rising edge and a falling edge variable delay circuit, the corrected duty cycle may equal any desired value—in other words, the corrected duty cycle need not equal 50% but may be less than or greater than this amount. The following discussion will be directed to embodiments in which the corrected duty cycle is 50% but it will be understood that 50% is just an example of the wide range of corrected duty cycles that may be achieved through the disclosed duty cycle correction circuit.

The difference between the uncorrected duty cycle and the corrected duty cycle determines which variable delay circuit (rising or falling edge) will be active. For example, if the uncorrected clock duty cycle is greater than a desired duty cycle, the rising edge variable delay circuit delays the rising edge for the uncorrected clock signal by a necessary amount to force the corrected clock signal's duty cycle to equal the desired duty cycle value. The falling edge variable delay circuit would introduce no delay in such a case. Conversely, if the uncorrected duty cycle is less than the desired duty cycle, the falling edge variable delay circuit delays the falling edge for the uncorrected clock signal by a necessary amount to force the corrected clock signal's duty cycle to equal the desired duty cycle value. The rising edge variable delay circuit would introduce no delay while the uncorrected duty cycle is less than the desired duty cycle.

To generate a corrected clock signal having the desired duty cycle, the rising edge variable delay circuit and the failing edge variable delay circuit may each drive a corresponding pair of switches in a pulse generator. For example, a first pair of switches for the pulse generator may be in series between a power supply node providing a power supply voltage VDD and an output node. Similarly, a second pair of switches for the pulse generator may be in series between the output node and ground. A latch such as formed using a cross-coupled pair of inverters latches a binary voltage state for the output node. Another inverter may drive the corrected clock signal responsive to inverting the binary voltage state of the output node. It will be appreciated that such inversion of the output node voltage is useful with regard to buffering and output drive strength but may be omitted in alternative embodiments.

Given this inversion of the output node voltage, the corrected clock signal may be 180 degrees out of phase with the uncorrected clock signal. In such a case, the rising edge variable delay circuit, which delays the rising edge of the uncorrected clock signal, is then adjusting the falling edge of the corrected clock signal. Similarly, the falling edge variable delay circuit, which delays the falling edge of the uncorrected clock signal, is then adjusting the rising edge of the corrected clock signal. In alternative embodiments in which the output node voltage is not inverted with respect to driving the corrected clock signal, the rising and falling edge variable delay circuits delay their respective clock edges in both the corrected and uncorrected clock signals.

An example duty cycle correction circuit 100 is shown in FIG. 1A. A falling edge variable delay circuit 105 delays (if necessary) the uncorrected clock signal into a first delayed signal that is also designated herein as signal b. Similarly, a rising edge variable delay circuit 150 delays (if necessary) the uncorrected clock signal into a second delayed signal that is also designated as signal b'. Each of these variable delay circuits is responsive to a respective control signal (not illustrated) that controls the independent amounts of applied delay. In that regard, the construction of a variable delay circuit such as delay circuits 105 and 150 is well known in the delay circuit arts and is thus not further discussed herein. The control signal for each delay circuit 105 and 150 may be analog or digital. To generate the control signals, a duty cycle analyzer (not illustrated) analyzes the corrected duty cycle in the corrected clock signal produced by duty cycle correction circuit 100. Such a duty cycle analyzer is a typical part of any duty cycle correction circuit and thus will not be discussed further herein. But what was not part of conventional duty cycle correction circuits was the ability to independently delay the rising and falling edges as follows.

An inverter 110 inverts the first delayed signal b into an inverted first delayed signal (also designated as signal a) that controls a first switch in the first pair of switches for a pulse generator 175. For example, the first switch may comprise a first switch PMOS transistor 115 that has a source coupled to a power supply node providing a power supply voltage VDD. The second switch in the first pair of switches may similarly comprise a second switch PMOS transistor 120 having a source coupled to a drain of first switch PMOS transistor 115. Falling edge variable delay circuit 105 drives a gate of second switch PMOS transistor 120 with signal a. A drain of second switch PMOS transistor 120 couples to an output node 125 for pulse generator 175.

Given such a configuration, an output node voltage for output node 125 will be pulsed high to the power supply voltage VDD as follows. When the uncorrected clock signal is high for a suitable period after its rising edge, first switch PMOS transistor 115 is switched on but it cannot charge output node 125 since second switch PMOS transistor 120 is off. As the uncorrected clock signal transitions low subsequent to its falling edge, second switch transistor 120 turns on signal b will also transition low (albeit with some delay if necessary through falling edge variable delay circuit 105). First switch PMOS transistor 115 will then turn off because signal a will transition high but this takes some delay with respect to the turning on of second switch PMOS transistor 120 due to the processing delay through inverter 110. Output node 125 will thus be pulsed to VDD when second switch PMOS transistor 120 switches on after a falling edge in the uncorrected clock signal.

First switch PMOS transistor 115 will switch off responsive to the falling edge in signal b because signal a then transitions high. To prevent output node 125 from then floating as first switch PMOS transistor 115 switches off, a latch 130 such as formed using cross-coupled inverters 135 and 140 latches the high state for output node 125 and thus maintains the output node voltage high at VDD. Since the output node voltage may be inverted through an inverter 145 to form the corrected clock signal, the delay of the falling edge of the uncorrected clock signal by falling edge variable delay circuit 105 translates into a delay of the rising edge in the corrected clock signal. Alternatively, if the output node voltage is not inverted to form the corrected clock signal, falling edge variable delay circuit 105 delays the falling edge of the corrected clock signal.

After the output node voltage transitions high, it will then remain high through the latching action of latch 130 until it is brought low as follows through rising edge variable delay circuit 150. Rising edge variable delay circuit 150 delays (if necessary) the uncorrected clock signal into a second delayed signal (also designated as signal b') that controls a first switch in the second pair of switches for pulse generator 175. For example, this first switch may comprise a first switch NMOS transistor 155 that has a drain coupled to output node 125 and a gate driven by signal b'. An inverter 160 inverts signal b' from rising edge variable delay circuit 150 into an inverted second delayed signal (also designated as signal a') that controls a second switch in the second pair of switches. For example, this second switch may comprise a second switch NMOS transistor 165 having a source coupled to ground and a drain coupled to a source for first switch NMOS transistor 155. Inverter 160 drives a gate for second switch NMOS transistor 165 with the signal a'.

For duty cycle correction circuit 100, the output node voltage will be pulsed low as follows. After the uncorrected clock signal transitions low, second switch NMOS transistor 165 switches on as signal a' will be driven high but second switch NMOS transistor 165 cannot discharge output node 125 since first switch NMOS transistor 155 is off. As the uncorrected clock transitions high subsequent to a rising edge, signal b' will also transition high, albeit with any delay (if necessary) as implemented through rising edge variable delay circuit 150. First switch NMOS transistor 155 then turns on. There will then be a delay as determined by the processing delay through inverter 160 before second switch NMOS transistor 165 turns off. The output node voltage is thus pulsed low to ground responsive to the rising edge of signal b', which in turn is pulsed high responsive to the rising edge of the uncorrected clock as delayed through rising edge variable delay circuit 150.

To prevent the turning off of second switch transistor 165 from floating the output node voltage, latch 130 latches the low state for output node 125 and thus maintains the output node voltage low for the remainder of the uncorrected clock cycle. Since the output node voltage is inverted to form the corrected clock signal, the delay of the rising edge for the uncorrected clock signal by rising edge variable delay circuit 150 translates into a delay of the falling edge in the corrected clock signal. Alternatively, if the output node voltage is not inverted to form the corrected clock signal, rising edge variable delay circuit 150 delays the rising edge of the corrected clock signal.

Duty cycle correction circuit 100 enjoys a number of advantages as compared to conventional duty cycle correction circuits. For example, the uncorrected clock frequency range for duty cycle correction circuit 100 is very wide due to the ability to independently delay either the rising edge or the falling edge of the uncorrected clock signal. In particular, low frequency performance is enhanced as there is no need for creating a complementary clock edge using a one-half-period delay. In addition, the desired duty cycle may be varied from 50% whereas conventional duty cycle correction circuits that create the complementary clock edge using a half-period delay cannot adjust to anything other than a 50% duty cycle. In addition, since the variable delay paths for the both the rising and falling edges are balanced, the disclosed duty cycle correction circuit has better jitter performance and introduces minimal distortion.

Note that it is arbitrary which switch in the first pair of switches in pulse generator 175 is driven by signal a versus signal b. Similarly, the second pair of switches in pulse generator 175 need not be driven by the particular order of signals a' and b' shown in FIG. 1A. For example, a duty cycle correction circuit 170 shown in FIG. 1B includes inverters 110 and 160 but in reversed positions with regard to the corresponding pair of switches. Thus, inverter 110 drives the gate of second switch PMOS transistor 120 with signal a. Similarly, falling edge variable delay circuit 105 drives the gate of first switch PMOS transistor 115 with signal b. In contrast, first switch PMOS transistor 115 was driven by signal a and second switch PMOS transistor 120 driven by signal b in duty cycle correction circuit 100 of FIG. 1A. Similarly, in duty cycle correction circuit 170, inverter 160 drives first switch NMOS transistor 155 with signal a' whereas rising edge variable delay circuit 150 drives second switch NMOS transistor 165 with signal b'. These switch/signal combinations are reversed in duty cycle correction circuit 100.

In one embodiment, falling edge variable delay circuit 105 and rising edge variable delay circuit 150 may be deemed to comprise a means for independently delaying an uncorrected clock signal into a first delayed signal and a second delayed signal such as signals b and b'.

Figure 2:
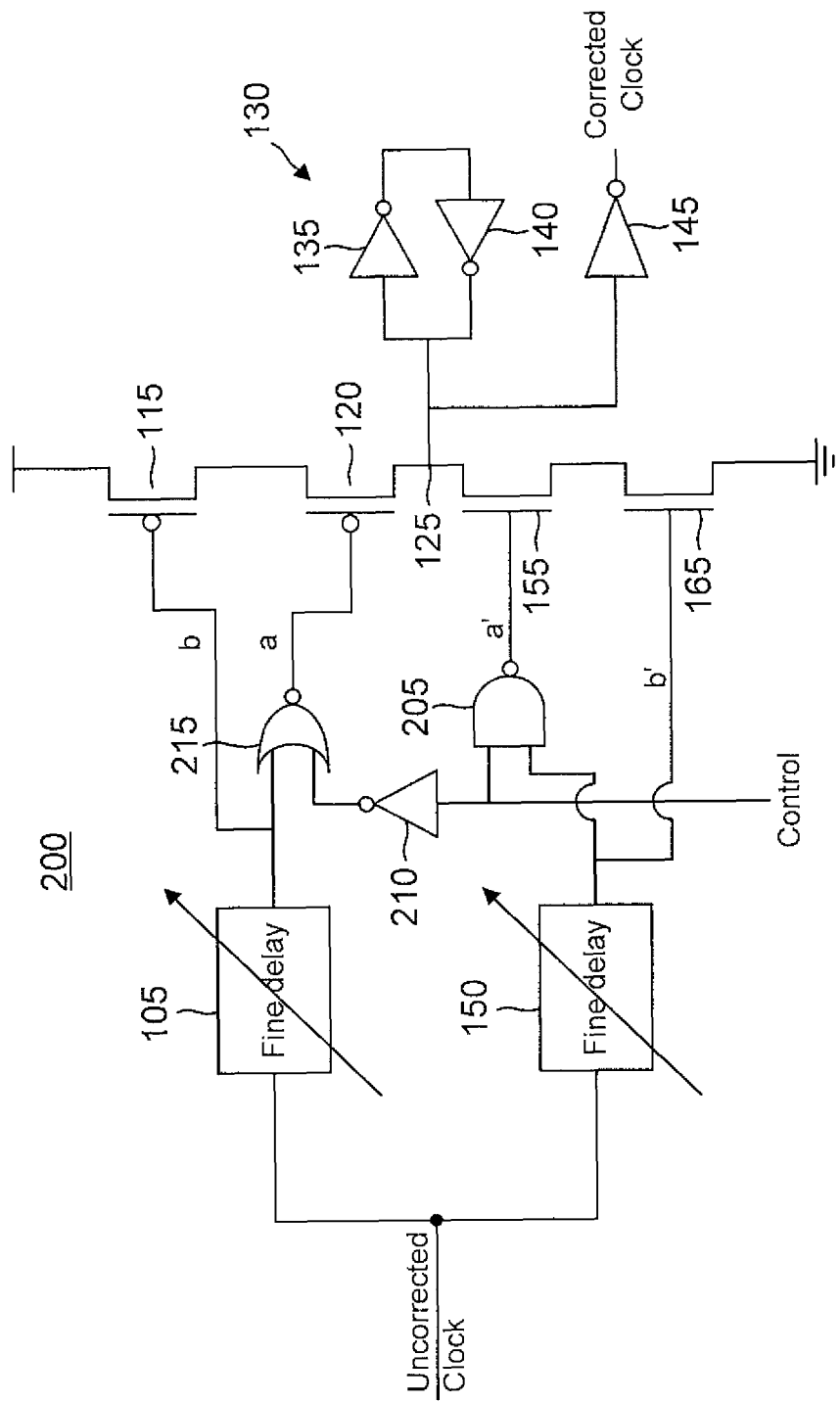
FIG. 2 is a circuit diagram of a duty cycle correction circuit in accordance with a third embodiment of the disclosure.

It will be appreciated that numerous alternative embodiments may be created that incorporate the independent delay of the rising and falling edge feature as discussed with regard to duty cycle correction circuits 100 and 170. In that regard, the uncorrected clock may be bursted—i.e., be discontinuous. In such a case, the discontinuity could cause glitches in duty cycle correction circuit 100 as first switch transistors 115 and 155 as well as second switch transistors 165 and 120 would not be in known on or off states prior to a clock edge at the start of a clock burst. A duty cycle correction circuit 200 shown in FIG. 2 avoids any glitches for these transistors. In duty cycle correction circuit 200, falling edge variable delay circuit 105, rising edge variable delay circuit 150, first switch transistors 115 and 155, second switch transistors 120 and 165, latch 130, and inverter 145 all operate as discussed with regard to duty cycle correction circuits 100 and 170. However, inverter 110 in duty cycle correction circuit 200 is replaced by a logic gate such as a NOR gate 215. Similarly, inverter 160 is replaced by a logic gate such as a NAND gate 205 that drives the gate of first switch transistor 155.

A control signal drives an input for NAND gate 205, which also receives signal b' from rising edge variable delay circuit 150. If the control signal is driven low, NAND gate 205 will thus drive signal a' high to turn on first switch transistor 155, which then has a known state regardless of the state of the uncorrected clock signal. When the control signal is driven high, NAND gate 205 functions as discussed with regard to inverter 160.

An inverter 210 inverts the control signal into an inverted control signal that is received by NOR gate 215, which drives the gate of second switch PMOS transistor 120 with signal a. NOR gate 215 also receives signal b from falling edge variable delay circuit 105. When the control signal is low, NOR gate 215 will thus not respond to the signal b but will instead ground signal a to force second switch PMOS transistor 120 into the known state of being on. When the control signal is driven high, NOR gate 215 functions as discussed with regard to inverter 110. In this fashion, duty cycle correction circuit 200 may function analogously as discussed with regard to duty cycle correction circuit 100 while the control signal is asserted high and have a known default state while the control signal is asserted low.

Note that one cannot be sure what state the uncorrected clock will have at the start of an uncorrected clock burst. The uncorrected clock could be high or it could be low in such a case. To protect against glitches, the control signal may be de-asserted (grounded) at the start of the burst. In this fashion, both second switch transistor 120 and first switch transistor 155 will be on at the start of the clock burst. It thus doesn't matter whether the uncorrected clock is high or low at the start of the burst—if the uncorrected clock is high, rising edge delay circuit 150 will drive signal b' high so as to turn on second switch transistor 165. Output node 125 will then be grounded as expected following a rising edge of the uncorrected clock. Conversely if the uncorrected clock is low at the start of the burst, falling edge delay circuit 105 will drive signal b low so that first switch transistor 115 is switched on. Output node 125 will then be charged to VDD as expected following a falling edge of the uncorrected clock. It will thus be appreciated that de-asserting the control signal protects against glitches. Once the control signal is asserted high, normal operation of duty cycle correction circuit 200 may resume analogously as discussed with regard to duty cycle correction circuit 100. Thus, the control signal serves to define the initial state/condition of the output node voltage when duty cycle correction circuit is powered on when enabled.

As shown for duty cycle control circuit 100, pulse generator 175 may comprise the stack formed by first and second switch transistors 115, 120, 155, and 165 so that the output node voltage is either pulsed high or low as discussed above. But this pulse generation may involve some current dissipation. For example, when output node 125 is latched low, an NMOS transistor (not illustrated) in inverter 140 is discharging output node 125 to ground. As first and second switch transistors 115 and 120 charge output node 125 high, this charging must initially struggle against this conducting NMOS transistor until the latched state in latch 130 "flips" its binary state. A similar struggle would occur with a PMOS transistor (not illustrated) in inverter 140 when first and second switch transistors 155 and 165 attempt to pull output node 125 low. These struggles between pulse generator 175 and latch 130 thus may dissipate some current.

Figure 3A:
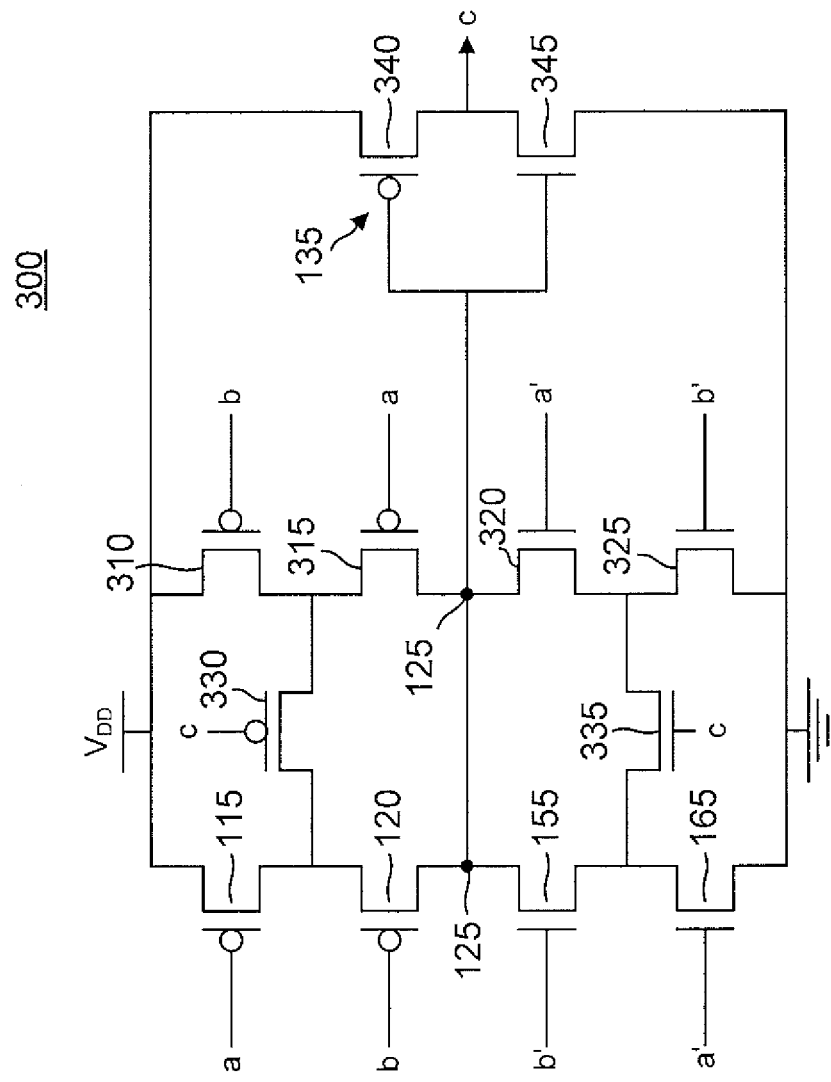
FIG. 3A is a circuit diagram of a pulse generator in accordance with a fourth embodiment of the disclosure.

Alternative pulse generator embodiments have reduced current dissipation. For example, a pulse generator 300 shown in FIG. 3A includes the stack of first and second switch transistors 115, 120, 155, and 165. But these transistors are also involved in forming a latch as follow. Pulse generator 300 includes a second stack of first and second switch transistors in parallel with the stack formed by first and second switch transistors 115, 120, 155, and 165. In particular, a first switch PMOS transistor 310 has its source coupled to the power supply node and a drain coupled to a source of a second switch PMOS transistor 315. A drain of second switch PMOS transistor 315 couples to output node 125. First and second switch transistors 310 and 315 are thus analogous to first and second switch transistors 115 and 120. But their control is reversed such that first switch transistor 310 is controlled by signal b whereas first switch transistor 115 is controlled by signal a. Similarly, second switch transistor 120 is controlled by signal b whereas second switch transistor 315 is controlled by signal a.

First and second switch NMOS transistors 320 and 325 are also analogous to first and second switch transistors 155 and 165. The drain of first switch transistor 320 couples to output node 125 and its source couples to a drain of second switch transistor 325. The source of second switch transistor 325 couples to ground. A PMOS transistor 330 couples between the drains of first switch transistors 115 and 310. Similarly, an NMOS transistor 335 couples between the sources of first switch transistors 155 and 320. Inverter 135 produces an internal signal c at the drain of a PMOS transistor 340 that has its source coupled to the power supply node. An NMOS transistor 345 that has its drain coupled to the drain of PMOS transistor 340 completes inverter 135. Output node 125 drives the gates of the transistors in inverter 135. Internal signal c drives the gates of transistor 330 and 335.

Operation of pulse generator 300 utilizes the complementary nature of signals a and b as well as signals a' and b'. In that regard, signals a and b have complementary states except during the brief period when output node 125 is pulsed high. Similarly, signals a' and b' have complementary states except during the brief period when output node 125 is pulsed low. With regard to transistors 330 and 335, one will be conducting and one will be shut off depending upon the voltage state for internal signal c. If the output node 125 is discharged, inverter 135 drives internal signal c high so that transistor 335 is conducting. At the same time, one of second switch transistors 165 and 325 will be conducting due to the complementary nature of signals a' and b'. Thus transistor 325 will have a source coupled to ground through whatever second switch transistor 165 or 325 is conducting. In addition, one of first switch transistors 155 and 320 will also be conducting such that a drain for transistor 325 couples to output node 125 through the conducting first switch transistor (either 155 or 320).

Figure 1B:
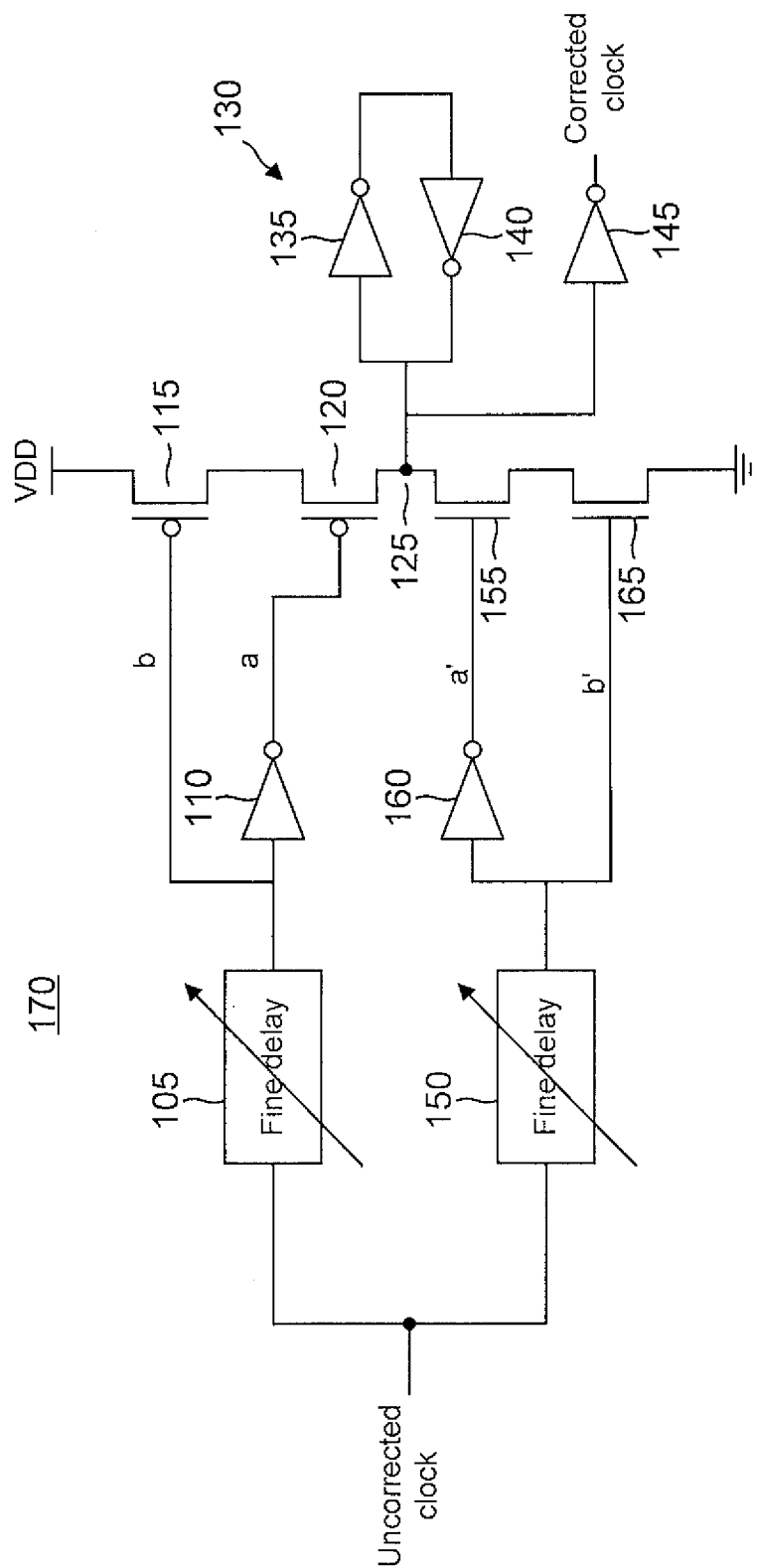
FIG. 1B is a circuit diagram of a duty cycle correction circuit in accordance with a second embodiment of the disclosure.

Transistor 330 is analogous to transistor 335 in that it will have a source terminal that couples to the power supply node through a conducting one of first switch transistors 115 and 310 and will also have a drain coupled to output node 125 through a conducting one of second switch transistors 120 and 315. Transistors 335 and 330 thus form an inverter analogous to inverter 140 of duty cycle correction circuit 100 that is cross-coupled with inverter 135 so that the voltage state for output node 125 is latched accordingly. Unlike inverter 140, transistor 335 will never discharge output node 125 while first and second switch transistors 115 and 120 (and also 310 and 315) are charging output node 125. In that regard, suppose the uncorrected clock has transitioned low such that signals a and b are both low momentarily. Signal a' had been low prior to the low transition of the uncorrected clock such that first switch transistor 320 and second switch transistor 165 will still be off momentarily subsequent to the low transition of the uncorrected clock due to the processing delay through inverter 160 (FIGS. 1A and 1B). But signal b' will transition low approximately at the same time that signal b transitioned low such that there is no path to ground for output node 125 while first and second switch transistors 115, 310, 120 and 315 pulse output node 125 high. There is thus no struggle with a discharging NMOS transistor while output node 125 is charged.

The discharge of output node 125 functions analogously with regard to each rising edge of the uncorrected clock. Prior to the rising edge, signal a is high such that first switch transistor 115 and second switch transistor 315 are both off. After the rising edge, signal b is brought high but signal a will still be high momentarily due to the processing delay in inverter 110 (FIGS. 1A and 1B). First and second switch transistors 155, 320, 165, and 325 may thus discharge output node 125 without struggling against any PMOS transistors that would otherwise be charging output node 125.

Figure 3B:
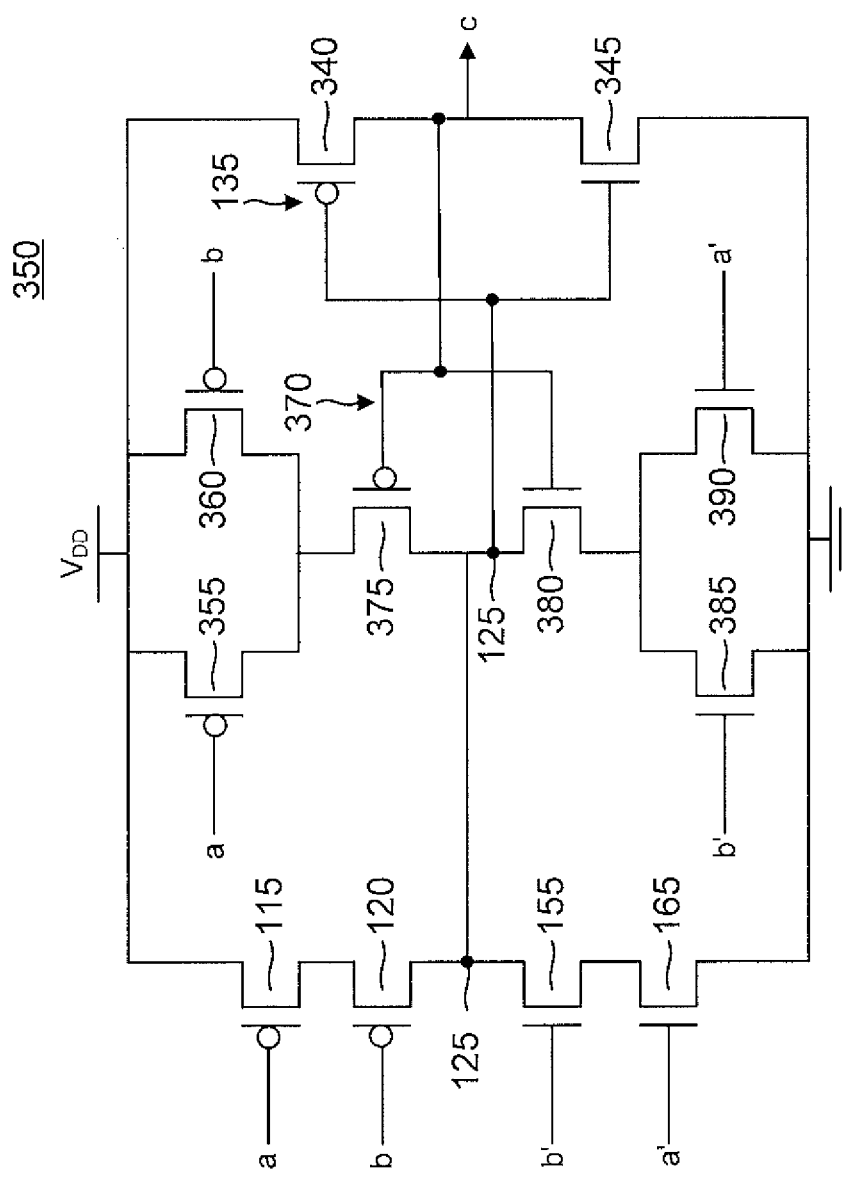
FIG. 3B is a circuit diagram of a pulse generator in accordance with a fifth embodiment of the disclosure.

An alternative pulse generator 350 is shown in FIG. 3B. First and second switch transistors 115, 120, 155, and 165 function as discussed earlier. Similarly, inverter 135 functions as discussed with regard to pulse generator 300. A latch is formed from an inverter 370 that is cross coupled with inverter 135. A PMOS transistor 375 in inverter 370 has its drain coupled to output node 125 and to the drain of an NMOS transistor 380. One of these transistors 380 or 375 will be on depending upon whether internal signal c is high or low. But neither transistor 380 or 375 will fight with the charging or discharging of output node 125 by the stack formed by first and second switch transistors 115, 120, 155, and 165. For example, the source of PMOS transistor 375 couples to the power supply node through a pair of PMOS transistors 355 and 360 arranged in parallel between the source of PMOS transistor 375 and the power supply node. PMOS transistors 355 and 360 prevent PMOS transistor 375 from opposing a discharge of output node 125 by first and second switch transistors 155 and 165. In that regard, signal a drives the gate of PMOS transistor 355 whereas signal b drives the gate of PMOS transistor 360. After a rising edge of the uncorrected clock, first and second switch transistors 155 and 165 will both be on to pulse output node 125 low (note that whichever switch transistor that is driven by signal a' will only be momentarily on, which in pulse generator 350 is second switch transistor 165). Subsequent to this rising edge, PMOS transistor 355 was off. After the rising edge, PMOS transistor 360 is also off while PMOS transistor 355 remains momentarily off due to the processing delay in inverter 110 (FIG. 1A). Thus, there is no connection to the power supply node at the source of PMOS transistor 375 while output node 125 is discharging, which prevents any struggle with regard to PMOS transistor 375.

The charging of output node 125 is analogous in that a source of NMOS transistor 380 couples to ground through parallel-arranged NMOS transistors 385 and 390. Signal a' drives the gate of NMOS transistor 390 whereas signal b' drives the gate of NMOS transistor 385. Prior to a falling edge of the uncorrected clock, NMOS transistor 390 is thus off. After the rising edge, NMOS transistor 385 will switch off while NMOS transistor 390 remains momentarily off due to the processing delay through inverter 160 (FIG. 1A). First and second switch transistors 115 and 120 may thus charge output node 125 high without struggling against any discharge by NMOS transistor 380. A duty cycle correction method will now be discussed.

Figure 4:
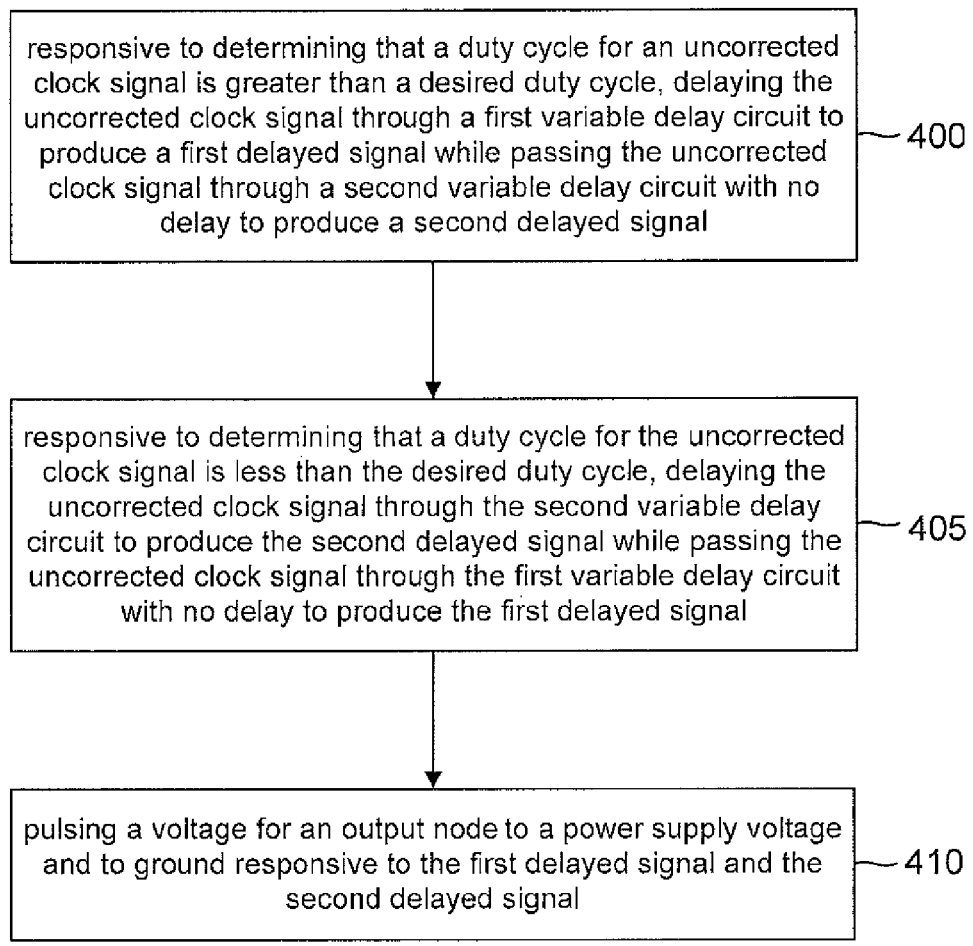
FIG. 4 is a flowchart for a method of operation for the various duty cycle correction circuits disclosed herein.

Turning now to FIG. 4, a flowchart for a duty cycle method is provided. The method includes a step 400 that is responsive to determining that a duty cycle for an uncorrected clock signal is greater than a desired duty cycle. Step 400 comprises delaying the uncorrected clock signal through a falling edge variable delay circuit to produce a first delayed signal while passing the uncorrected clock signal with no delay through a rising edge variable delay circuit to produce a second delayed signal. An example of such an act is discussed, for example, with regard to the generation of signals b and b' by duty cycle correction circuit 100 when the uncorrected duty cycle is too high as compared to the desired duty cycle.

The method includes a complementary step 405 that is responsive to determining that the duty cycle for the uncorrected clock signal is less than a desired duty cycle. Step 405 comprises delaying the uncorrected clock signal through the rising edge variable delay circuit to produce the second delayed signal while passing the uncorrected clock signal through the falling edge variable delay circuit with no delay to produce the first delayed signal. An example of such an act is discussed, for example, with regard to the generation of signals b and b' by duty cycle correction circuit 100 when the uncorrected duty cycle is too low as compared to the desired duty cycle.

Regardless of whether the uncorrected duty cycle was too high or too low, the method of FIG. 4 further includes a step 410 of pulsing an output node voltage to a power supply voltage responsive to the first delayed signal and pulsing the output node voltage to ground responsive to the second delayed signal. The pulsing of the voltage for output node 125 in, for example, duty cycle correction circuit 100 is an example of step 410.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A duty cycle correction circuit, comprising:
a falling edge variable delay circuit for delaying a rising edge of an uncorrected clock signal into a first delayed signal;
a first inverter for inverting the first delayed signal into an inverted first delayed signal;
a rising edge variable delay circuit for delaying a falling edge of the uncorrected clock signal into a second delayed signal;
a second inverter for inverting the second delayed signal into an inverted second delayed signal; and
a pulse generator configured to pulse an output node voltage to a power supply voltage responsive to the first delayed signal and the first inverted delayed signal, the pulse generator being further configured to pulse the output node voltage to ground responsive to the second delayed signal and the second inverted delayed signal, wherein the pulse generator includes a first pair of switches, a second pair of switches, a third pair of switches, and a fourth pair of switches, and wherein the first pair of switches are serially connected between an output node carrying the output node voltage and a power supply node, the second pair of switches are serially connected between the output node and ground, the third pair of switches are coupled between the output node and the power supply node, and the fourth pair of switches are coupled between the output node and ground.

2. The duty cycle correction circuit of claim 1, further comprising a latch configured to latch the pulsed output node voltage.

3. The duty cycle correction circuit of claim 2, further comprising a third inverter for inverting the latched pulsed output node voltage to form a corrected clock signal.

4. The duty cycle correction circuit of claim 1, wherein the first pair of switches comprises a first PMOS transistor having a gate coupled to a node carrying the first delayed signal and a second PMOS transistor having a gate coupled to a node carrying the inverted first delayed signal.

5. The duty cycle correction circuit of claim 1, wherein the second pair of switches comprises a first NMOS transistor having a gate coupled to a node carrying the second delayed signal and a second NMOS transistor having a gate coupled to a node carrying the inverted second delayed signal.

6. The duty cycle correction circuit of claim 1, further comprising a cross-coupled pair of inverters, wherein the cross-coupled inverters are cross-coupled through switches in the first pair of switches, the second pair of switches, the third pair of switches, and the fourth pair of switches.

7. The duty cycle correction circuit of claim 1, further comprising a cross-coupled pair of inverters wherein one of the cross-coupled inverters is configured to invert the output node voltage.

8. The duty cycle correction circuit of claim 7, wherein the third set of switches is coupled between the power supply node and a PMOS transistor for a remaining one of the cross-coupled inverters.

9. The duty cycle correction circuit of claim 7, wherein the fourth set of switches is coupled between ground and an NMOS transistor for a remaining one of the cross-coupled inverters.

10. The duty cycle correction circuit of claim 1, further comprising a third inverter configured to invert a control signal into an inverted control signal, and wherein the first inverter comprises a first logic gate configured to process the first delayed signal and the inverted control signal to form the inverted first delayed signal, and wherein the second inverter comprises a second logic gate configured to process the second delayed signal and the control signal to form the inverted second delayed signal.

11. The duty cycle correction circuit of claim 10, wherein the first logic gate comprises a NOR gate and wherein the second logic gate comprises a NAND gate.

12. A method, comprising:
responsive to determining that a duty cycle for an uncorrected clock signal is greater than a desired duty cycle, delaying a falling edge of the uncorrected clock signal through a falling edge variable delay circuit to produce a first delayed signal while passing the uncorrected clock signal through a rising edge variable delay circuit with no delay to produce a second delayed signal;
responsive to determining that the duty cycle for the uncorrected clock signal is less than the desired duty cycle, delaying a rising edge of the uncorrected clock signal through the rising edge variable delay circuit to produce the second delayed signal while passing the uncorrected clock signal through the falling edge variable delay circuit with no delay to produce the first delayed signal;
pulsing an output node voltage to a power supply voltage responsive to the first delayed signal and pulsing the output node voltage to ground responsive to the second delayed signal;
producing a corrected clock signal having the desired duty cycle from the pulsed output node voltage; and
inverting the first delayed signal to form an inverted first delayed signal, wherein pulsing the output node voltage to the power supply voltage comprises pulsing the output node voltage to the power supply voltage when the first delayed signal and the inverted first delayed signal are both grounded, wherein inverting the first delayed signal comprises processing the first delayed signal with a control signal in a logic gate.

13. The method of claim 12, further comprising inverting the second delayed signal to form an inverted second delayed signal, wherein pulsing the output node voltage to ground comprises grounding the output node voltage when the second delayed signal and the inverted second delayed signal are both charged to the power supply voltage.

14. The method of claim 13, wherein inverting the second delayed signal comprises processing the second delayed signal with a control signal in a logic gate.

15. The method of claim 12, further comprising latching the pulsed output node voltage.

16. The method of claim 15, wherein producing the corrected clock signal comprises inverting the latched pulsed output node voltage to produce the corrected clock signal.

17. A duty cycle correction circuit, comprising:
means for variably delaying a rising edge of an uncorrected clock signal into a first delayed signal and for variably delaying a falling edge of the uncorrected clock signal into a second delayed signal;
a pulse generator configured to pulse an output node voltage to a power supply voltage responsive to the first delayed signal, the pulse generator being further configured to pulse the output node voltage to ground responsive to the second delayed signal;
a first inverter configured to invert the output node voltage into a corrected clock signal; and
a second inverter configured to invert the first delayed signal into an inverted first delayed signal, wherein the pulse generator is further configured to pulse the output node voltage to the power supply voltage when both the first delayed signal and the inverted first delayed signal are grounded, wherein the second inverter comprises a NOR gate.

18. The duty cycle correction circuit of claim 17, further comprising:
a third inverter configured to invert the second delayed signal into an inverted second delayed signal, wherein the pulse generator is further configured to pulse the output node voltage to ground when both the second delayed signal and the inverted second delayed signal are charged to the power supply voltage.

19. The duty cycle correction circuit of claim 18, wherein the third inverter comprises a NAND gate.

20. The duty cycle correction circuit of claim 18, wherein the pulse generator comprises a first pair of switches and a second pair of switches.

21. The duty cycle correction circuit of claim 20, wherein the first pair of switches are serially connected between an output node carrying the output node voltage and a power supply node, and wherein the second pair of switches are serially connected between the output node and ground.

* * * * *